US012721095B2

(12) United States Patent
Nakagomi et al.

(10) Patent No.: US 12,721,095 B2
(45) Date of Patent: Aug. 25, 2026

(54) CONVEYANCE METHOD AND PROCESSING SYSTEM

(71) Applicant: TOKYO ELECTRON LIMITED, Tokyo (JP)

(72) Inventors: Wataru Nakagomi, Nirasaki City (JP); Shotaro Murakawa, Nirasaki City (JP); Naoyuki Sato, Nirasaki City (JP); Fumitaka Sento, Nirasaki City (JP); Tatsuya Mukoyama, Nirasaki City (JP); Shigeru Kubota, Nirasaki City (JP); Keisuke Hiraide, Nirasaki City (JP)

(73) Assignee: Tokyo Electron Limited, Tokyo (JP)

( * ) Notice: Subject to any disclaimer, the term of this patent is extended or adjusted under 35 U.S.C. 154(b) by 725 days.

(21) Appl. No.: 18/027,886

(22) PCT Filed: Sep. 10, 2021

(86) PCT No.: PCT/JP2021/033312
§ 371 (c)(1),
(2) Date: Mar. 22, 2023

(87) PCT Pub. No.: WO2022/065077
PCT Pub. Date: Mar. 31, 2022

(65) Prior Publication Data

US 2023/0411194 A1 Dec. 21, 2023

(30) Foreign Application Priority Data

Sep. 24, 2020 (JP) ................................ 2020-159632

(51) Int. Cl.
*G05B 19/4155* (2006.01)
*H10P 72/30* (2026.01)

(52) U.S. Cl.
CPC ...... *H10P 72/3216* (2026.01); *G05B 19/4155* (2013.01); *G05B 2219/39106* (2013.01)

(58) Field of Classification Search
CPC .......... H01L 21/67727; G05B 19/4155; G05B 2219/39106
See application file for complete search history.

(56) References Cited

U.S. PATENT DOCUMENTS

2010/0086670 A1* 4/2010 Kushibiki ......... H01J 37/32935 118/697
2022/0171373 A1* 6/2022 Chau ................ G05B 19/41885

FOREIGN PATENT DOCUMENTS

JP 2008-160000 A 7/2008

OTHER PUBLICATIONS

PCT International Search Report and Written Opinion, PCT Application No. PCT/JP2021/033312, Dec. 14, 2021, 8 pages (with English translation of PCT International Search Report).

* cited by examiner

*Primary Examiner* — Gary Collins
(74) *Attorney, Agent, or Firm* — Fenwick & West LLP

(57) ABSTRACT

This method is for conveying, in a processing system comprising at least one processing unit that performs a desired process on substrates and a conveyance unit that conveys the substrates to the processing unit, a plurality of substrates, which are to be continuously processed, from the conveyance unit to the processing unit. To each of the substrates, an adjustment value for optionally changing processing time is assigned in advance. The method comprises: a step for acquiring an adjustment value allocated to a first substrate to be processed this time; a step for acquiring a reference adjustment value allocated to a reference substrate processed before the first substrate; a step for acquiring an actual time which is an actual time of processing (Continued)

performed on the reference substrate; a step for calculating a predictive processing time for the first substrate by reflecting, on the actual time, a difference between the adjustment value allocated to the first substrate and the reference adjustment time; and a step for adjusting, on the basis of the calculated predictive processing time, a conveyance timing of a second substrate to be processed after the first substrate.

12 Claims, 4 Drawing Sheets

*FIG. 3*

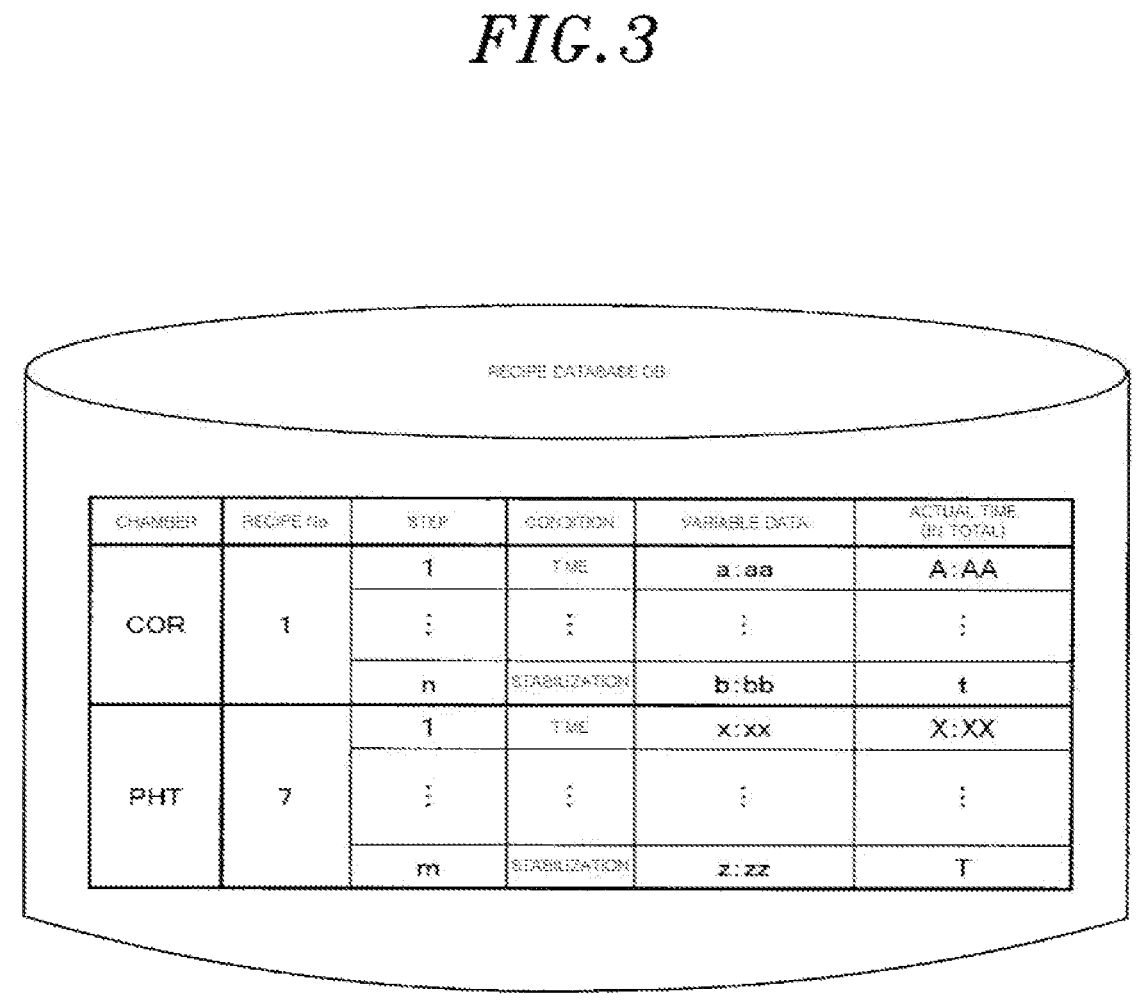

| CHAMBER | RECIPE No. | STEP | CONDITION | VARIABLE DATA | ACTUAL TIME (IN TOTAL) |
|---|---|---|---|---|---|
| COR | 1 | 1 | TIME | a:aa | A:AA |
| | | ⋮ | ⋮ | ⋮ | ⋮ |
| | | n | STABILIZATION | b:bb | t |
| PHT | 7 | 1 | TIME | x:xx | X:XX |
| | | ⋮ | ⋮ | ⋮ | ⋮ |
| | | m | STABILIZATION | z:zz | T |

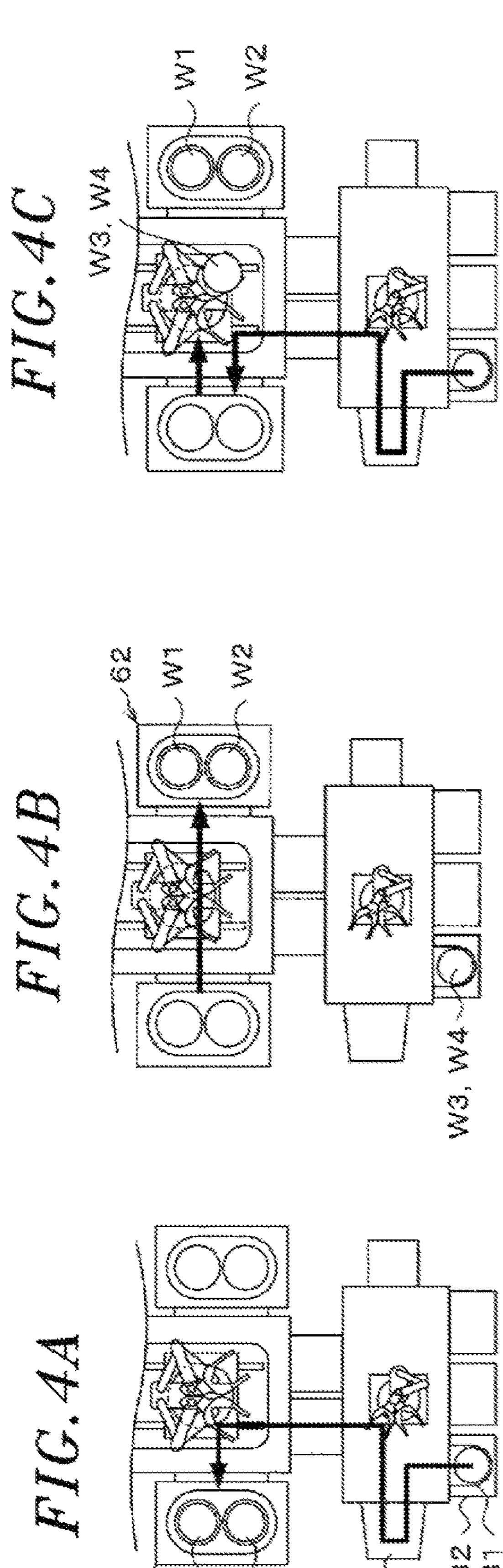
FIG. 4A
61
W1
W2
34
32
31
FIG. 4B
62
W1
W2
W3, W4
FIG. 4C
W3, W4
W1
W2
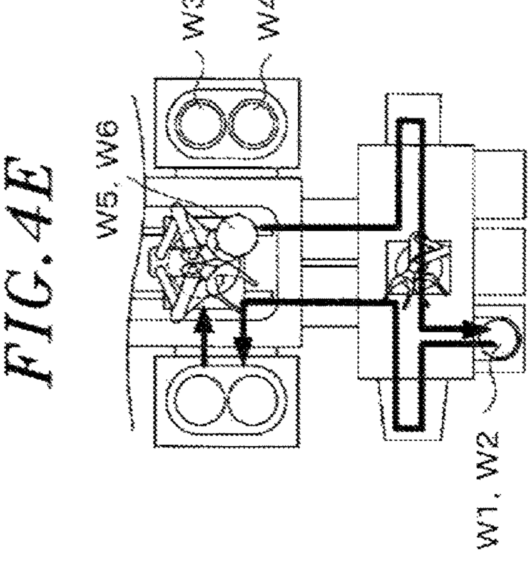
FIG. 4E
W5, W6
W3
W4
W1, W2
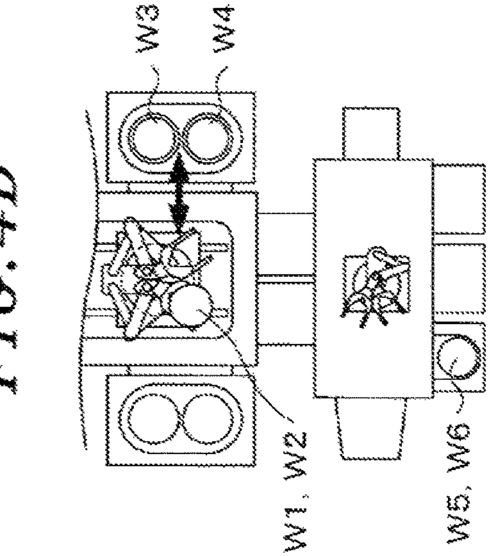
FIG. 4D
W3
W4
W1, W2
W5, W6

CONVEYANCE METHOD AND PROCESSING SYSTEM

TECHNICAL FIELD

The present disclosure relates to a substrate transfer method and a processing system.

BACKGROUND

Patent Document 1 discloses a gas processing apparatus comprising: a chamber for performing desired gas processing on a substrate accommodated therein; a transfer mechanism for continuously transferring a plurality of substrates to the chamber; and a control mechanism for controlling introduction of a processing gas and operation of the transfer mechanism so that the processing gas is introduced into the chamber before loading the substrate into the chamber and the substrate is loaded into the chamber after a predetermined time.

PRIOR ART DOCUMENTS

Patent Documents

Patent Document 1: Japanese Laid-open Patent Publication No. 2008-160000

SUMMARY

Problems to Be Resolved by the Invention

A technique according to the present disclosure appropriately adjusts a transfer timing of a plurality of substrates that are continuously processed in a substrate processing apparatus, and efficiently performs substrate processing in the substrate processing apparatus.

Means for Solving the Problems

One aspect of the present disclosure is, in a processing system comprising at least one processing unit for performing desired processing on a substrate and a transfer unit for transferring the substrate to the processing unit, a method of transferring a plurality of substrates to be continuously processed from the transfer unit to the processing unit. An adjustment value for arbitrarily changing a processing time for the substrate is assigned in advance to each of the plurality of substrates. The method includes: obtaining the adjustment value assigned to a first substrate to be processed at this time; obtaining a reference adjustment value assigned to a reference substrate processed prior to the first substrate; obtaining an actual time, which is time for an actual processing performed on the reference substrate; calculating a predicted processing time for the first substrate by reflecting a difference between the adjustment value assigned to the first substrate and the reference adjustment value in the actual time; and adjusting a transfer timing of a second substrate to be processed after the first substrate, based on the calculated predicted processing time.

Effect of the Invention

According to the present disclosure, a transfer timing of a plurality of substrates that are continuously processed in a substrate processing apparatus is appropriately adjusted, and substrate processing in the substrate processing apparatus is efficiently performed.

BRIEF DESCRIPTION OF THE DRAWINGS

FIG. 3 is an explanatory diagram showing details of recipe information recorded in a recipe database.

FIGS. 4A to 4E are explanatory diagram schematically showing how wafers are transferred according to the present embodiment.

DETAILED DESCRIPTION

Figure 1:
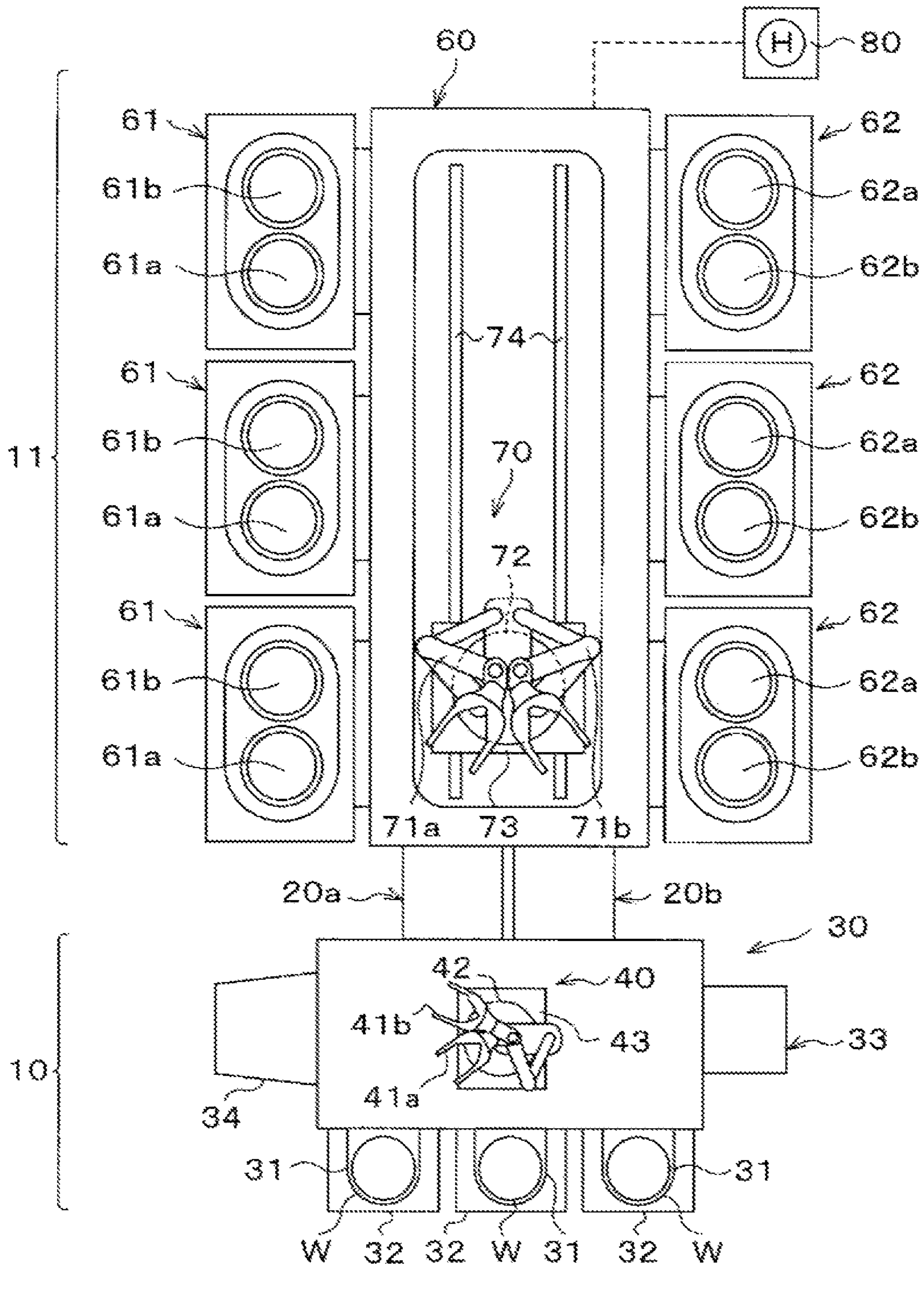
FIG. 1 is a plan view showing a schematic configuration of a substrate processing apparatus according to the present embodiment.

Conventionally, there is known a vacuum processing apparatus that transfers a semiconductor wafer (substrate: hereinafter simply referred to as a "wafer") under a vacuum atmosphere and performs various vacuum processes on the wafer. In this vacuum processing apparatus, transfer between various processing modules and various vacuum processing are sequentially and continuously performed for a plurality of wafers loaded into the vacuum processing apparatus.

The above-mentioned Patent Document 1 discloses a gas processing apparatus that sequentially performs Chemical Oxide Removal (COR) processing and Post Heat Treatment (PHT) processing on a wafer as vacuum processing. According to the gas processing apparatus disclosed in Patent Document 1, transfer of a wafer is controlled so that a plurality of wafers are continuously transferred to each processing chamber (processing module) according to instructions from a process controller.

In the transfer of the wafer and various vacuum processing, it is required to control a transfer timing of a wafer to various processing modules and to shorten processing standby time of the wafer in order to suppress a decrease in throughput in the vacuum processing apparatus.

Conventionally, in this controlling the transfer timing of the wafer, a "recipe actual time" (hereinafter, simply referred to as an "actual time" in some cases) created by saving as a recipe a measurement time when performing a target vacuum processing (recipe) on a wafer (hereinafter, referred to as a "preceding wafer") processed prior to a current wafer (hereinafter, referred to as the "current wafer") for which the timing control is to be performed is used. Specifically, wafer transfer can be optimized by predicting a time required for the same recipe performed on the current wafer using the actual time of the preceding wafer on which the target recipe was performed and by controlling the transfer timing of the current wafer in accordance with a timing of the end of the recipe.

By the way, the "actual time" for controlling the transfer timing of the wafer includes data (hereinafter, referred to as "variable data") for adjusting a processing time of the target recipe for the current wafer, for example, based on a processing result of previous processing of the current wafer, a processing result of the target recipe for the preceding wafer, or the like. The variable data is assigned and set for each of a plurality of wafers loaded into the vacuum processing apparatus, for example, by manual input by an operator or automatic input based on the processing result of the previous processing.

However, in the above-described conventional method for controlling the transfer timing of the wafer, the variable data assigned to each wafer is not taken into consideration, and there is a risk that the throughput decreases when the variable data differs between the preceding wafer and the current wafer. Specifically, the transfer timing of the current wafer is controlled based on the actual time of the preceding wafer as described above, but in this case, since the current wafer is transferred on the assumption that the variable data of the preceding wafer and the current wafer are the same, there is a risk that the transfer timing is not correctly predicted and that processing standby time occur, resulting in a decrease in throughput. Patent Document 1 does not disclose the decrease in throughput caused by such different variable data, and there is room for improvement from this point of view.

The technique according to the present disclosure has been made in view of the above circumstances, and appropriately adjusts a transfer timing of a plurality of substrates that are continuously processed in a substrate processing apparatus and efficiently performs substrate processing in the substrate processing apparatus.

Hereinafter, a vacuum processing apparatus according to one embodiment and a wafer transfer method according to this embodiment will be described with reference to the drawings. In this specification and drawings, elements having substantially the same functional configuration are denoted by the same reference numerals, thereby omitting redundant description.

<Vacuum Processing Apparatus>

First, a configuration of a vacuum processing apparatus according to one embodiment will be described. FIG. 1 is a plan view schematically showing an outline of a configuration of a vacuum processing apparatus 1. In this embodiment, a case where the vacuum processing apparatus 1 comprises a COR module and a PHT module as processing modules will be described as an example. A configuration of various processing modules included in the vacuum processing apparatus 1 of the present disclosure is not limited to this, and may be arbitrarily selected.

As shown in FIG. 1, the vacuum processing apparatus 1 has a configuration in which an atmospheric part 10 and a decompression part 11 are integrally connected via load lock modules 20*a* and 20*b*. The atmospheric part 10 includes a plurality of atmospheric modules that perform desired processing on a wafer W in an atmospheric pressure atmosphere. The decompression part 11 includes a plurality of decompression modules that perform desired processing on the wafer W in a decompressed atmosphere.

The load lock module 20*a* temporarily holds the wafer W in order to deliver the wafer W transferred from a loader module 30 of the atmospheric part 10, which will be described later, to a transfer module 60 of the decompression part 11, which will be described later. The load lock module 20*a* has a plurality of, for example, two stockers (not shown) inside, which hold two wafers W inside at the same time.

The load lock module 20*a* is connected to the loader module 30 and the transfer module 60, which will be described later, via a gate (not shown) provided with a gate valve (not shown). This gate valve ensures airtightness and mutual communication between the load lock module 20*a* and the loader module 30 and between the load lock module 20*a* and the transfer module 60.

An air supply unit (not shown) for supplying gas and an exhaust unit (not shown) for discharging gas are connected to the load lock module 20*a*, and the inside of the load lock module 20*a* can be switched between an atmospheric pressure atmosphere and a decompressed atmosphere by the air supply unit and the exhaust unit. That is, the load lock module 20*a* is configured so that the wafer W can be transferred appropriately between the atmospheric part 10 having an atmospheric pressure atmosphere and the decompression part 11 having a decompressed atmosphere.

The load lock module 20*b* temporarily holds the wafer W in order to deliver the wafer W transferred from the transfer module 60 to the loader module 30. The load lock module 20*b* has the same configuration as that of the load lock module That is, the load lock module 20*b* has a gate valve (not shown), a gate (not shown), an air supply unit (not shown), and an exhaust unit (not shown).

The number and arrangement of the load lock modules 20*a* and 20*b* are not limited to the present embodiment, and can be set arbitrarily.

The atmospheric part 10 has a loader module 30 having a wafer transfer mechanism 40 to be described later, load ports 32 for placing FOUPs 31 capable of storing a plurality of wafers W, a CST module 33 for cooling the wafer W, and an orienter module 34 for adjusting a horizontal orientation of the wafer W.

The loader module 30 has a rectangular housing inside, and the inside of the housing is maintained at an atmospheric pressure atmosphere. A plurality of, for example, three load ports 32 are arranged side by side on one side surface constituting long sides of the housing of the loader module 30. The load lock modules 20*a* and 20*b* are arranged side by side on the other side surface constituting the long sides of the housing of the loader module 30. The CST module 33 is provided on one side surface constituting short sides of the housing of the loader module 30. The orienter module 34 is provided on the other side surface constituting the short sides of the housing of the loader module 30.

The number and arrangement of the load ports 32, the CST modules 33, and the orienter modules 34 are not limited to the present embodiment, and can be set arbitrarily. Further, the type of atmospheric module provided in the atmospheric part 10 is not limited to the present embodiment, and can be arbitrarily selected.

The FOUP 31 accommodates a plurality of wafers W, for example, 25 wafers per lot. Further, the inside of the FOUP 31 placed on the load port 32 is filled with air, nitrogen gas, or the like, for example, and sealed.

The wafer transfer mechanism 40 for transferring the wafer W is provided inside the loader module 30. The wafer transfer mechanism 40 has transfer arms 41*a* and 41*b* that hold and move the wafer W, a rotating stand 42 that rotatably supports the transfer arms 41*a* and 41*b*, and a rotating placing stand 43 on which the rotating stand 42 is mounted. The wafer transfer mechanism 40 is configured to be movable in a longitudinal direction inside the housing of the loader module 30.

The decompression part 11 has the transfer module 60 for simultaneously transferring two wafers W to various processing modules, COR modules 61 for performing COR processing on the wafers W, and PHT modules 62 for performing PHT processing on the wafers W. The insides of the transfer module 60, the COR module 61, and the PHT module 62 are each maintained in a decompressed atmosphere. Further, a plurality of COR modules 61 and PHT modules 62 are provided for each transfer module 60, for example, three each.

The transfer module 60 as a transfer unit is made up of a rectangular housing inside, and is connected to the load lock modules 20*a* and 20*b* via gate valves (not shown) as described above. The transfer module 60 sequentially transfers the wafer W loaded into the load lock module 20*a* to one COR module 61 and one PHT module 62 for COR processing and PHT processing, and then unloads the wafer W to the atmospheric part 10 via the load lock module 20*b*.

Two stages 61*a* and 61*b* on which two wafers W are horizontally placed side by side are provided inside the COR module 61 as a processing unit. The COR module 61 performs COR processing on two wafers W at the same time by placing the wafers W side by side on the stages 61*a* and 61*b*. An air supply unit (not shown) for supplying processing gas, purge gas, or the like and an exhaust unit (not shown) for discharging gas are connected to the COR module 61.

Two stages 62*a* and 62*b* on which two wafers W are horizontally placed side by side are provided inside the PHT module 62 as a processing unit. The PHT module 62 performs PHT processing on two wafers W at the same time by placing the wafers W side by side on the stages 62*a* and 62*b*. An air supply unit (not shown) for supplying gas and an exhaust unit (not shown) for discharging gas are connected to the PHT module 62.

Further, the COR module 61 and the PHT module 62 are connected to the transfer module 60 via a gate (not shown) provided with a gate valve (not shown). This gate valve ensures airtightness and mutual communication between the transfer module 60 and the COR module 61 and between the transfer module 60 and the PHT module 62.

The number, arrangement, and types of processing modules provided in the transfer module 60 are not limited to those of the present embodiment, and can be set arbitrarily.

A wafer transfer mechanism 70 for transferring the wafer W is provided inside the transfer module 60. The wafer transfer mechanism 70 has transfer arms 71*a* and 71*b* for holding and moving two wafers W vertically, a rotating stand 72 for rotatably supporting the transfer arms 71*a* and 71*b*, and a rotating placing stand 73 on which the rotating stand 72 is mounted. Further, a guide rail 74 extending in a longitudinal direction of the transfer module 60 is provided inside the transfer module 60. The rotating placing stand 73 is provided on the guide rail 74 so that the wafer transfer mechanism 70 can move along the guide rail 74.

A controller 80 is provided in the vacuum processing apparatus 1 described above. The controller 80 is, for example, a computer equipped with a Central Processing Unit (CPU), memory, or the like, and has a program storage unit (not shown). A program for controlling processing on the wafer W in the vacuum processing apparatus 1 is stored in the program storage unit. Further, the program storage unit also stores a program for controlling operations of the various processing modules described above and drive systems such as the transfer mechanism to control the transfer timing of the wafer in the vacuum processing apparatus 1, which will be described later. Specifically, for example, a "wafer transfer control task" for controlling a transfer operation of the wafer, which will be described later, a "recipe execution control task" for executing a recipe in the processing module, which will be described later, a "recipe management task" for managing the recipe in the processing module, which will be described later, and the like are stored. The program may be recorded in a computer-readable storage medium H and installed in the controller 80 from the storage medium H.

<Wafer Transfer Method>

The vacuum processing apparatus 1 according to the present disclosure is configured as described above. Next, wafer processing and wafer transfer performed using the vacuum processing apparatus 1 will be described. In the following description, an example will be described in which wafers W of one lot (25 wafers) accommodated in the FOUP 31 are continuously processed two by two. Further, "wafers W1 to W25" used in the following description mean that the wafers W of one lot (25 wafers) are numbered 1 to 25 in order of wafer processing.

Further, in normal wafer processing, the wafers W are processed in parallel using the plurality of COR modules 61 and PHT modules 62 provided in the decompression part 11, but in the following description, in order to clarify the description of controlling the transfer timing of the wafer, a case where all the wafers W1 to W25 are processed using the same COR module 61 and PHT module 62 will be described as an example.

First, the FOUP 31 containing a plurality of wafers W, that is, the wafers W of one lot (25 wafers) is loaded into the load port 32. When the FOUP 31 is placed on the load port 32, the wafer transfer mechanism 40 accesses the FOUP 31 and takes out the wafer W1 from the FOUP 31. The horizontal orientation of the wafer W1 unloaded from the FOUP 31 is adjusted by the orienter module 34. Next, the wafer W2 is taken out from the FOUP 31 while adjusting the horizontal orientation of the wafer W1.

The wafer W2 taken out from the FOUP 31 is loaded into the orientor module 34 and its horizontal orientation is adjusted immediately after the wafer W1 whose horizontal orientation has been adjusted is taken out from the orienter module 34.

The wafer W1 taken out from the orienter module 34 is transferred to a stocker (not shown) of the load lock module and temporarily held. Similarly, the wafer W2 whose horizontal orientation has been adjusted is taken out from the orienter module 34 and transferred to the stocker (not shown) of the load lock module 20*a*.

When the two wafers W1 and W2 are transferred to the load lock module 20*a*, the inside of the load lock module 20*a* is switched from an atmospheric pressure atmosphere to a decompressed atmosphere, and then communicated with the inside of the transfer module 60. Subsequently, the two wafers W1 and W2 are transferred to the transfer arm 71*a* of the wafer transfer mechanism 70 and loaded into the transfer module 60.

The wafer transfer mechanism 70 holding the two wafers W1 and W2 next moves to a position in front of one COR module 61. Subsequently, the transfer arm 71*a* enters the inside of the COR module 61, and the two wafers W1 and W2 are transferred to the stages 61*a* and 61*b* of the COR module 61, respectively. After that, the transfer arm 71*a* is withdrawn from the COR module 61, and the COR processing is performed on the two wafers W1 and W2. In the COR processing according to the present embodiment, at least one recipe is selectively executed according to the purpose from among a plurality of recipes for COR processing recorded in a recipe database DB, which will be described later.

When the COR processing of the two wafers W1 and W2 is started, two wafers W3 and W4 to be processed next are taken out from the FOUP 31, loaded into the load lock module 20*a* via the orienter module 34, and then further transferred to a position in front of one COR module 61 by the wafer transfer mechanism 70. Here, the transfer timing of the two wafers W3 and W4 to the one COR module 61 is controlled so that the wafers W3 and W4 arrive at a position in front of the one COR module 61 at a timing when the COR processing for the two wafers W1 and W2, which are the preceding wafers, is completed. That is, the transfer timing is controlled so that the unloading of the wafers W1 and W2 from one COR module 61 and the loading of the wafers W3 and W4 into the same COR module 61 can be performed at the same time. The details of the method of controlling the transfer timing will be described later.

Subsequently, when the COR processing for the wafers W1 and W2 is completed, the transfer arm 71*b* of the wafer transfer mechanism 70 enters the inside of the COR module 61, and the two wafers W1 and W2 are transferred from the stages 61*a* and 61*b* to the transfer arm 71*b*. Subsequently, the transfer arm 71*a* of the wafer transfer mechanism 70 enters the inside of the COR module 61, and the two wafers W3 and W4 are transferred from the transfer arm 71*a* to the stages 61*a* and 61*b*. After that, the transfer arm 71*a* is withdrawn from the COR module 61, and the COR processing is performed on the two wafers W3 and W4.

Next, the wafer transfer mechanism 70 holding the two wafers W1 and W2 moves to a position in front of one PHT module 62. Subsequently, the transfer arm 71*b* enters the PHT module 62, and the two wafers W1 and W2 are transferred to the stages 62*a* and 62*b* of the PHT module 62, respectively. After that, the transfer arm 71*b* is withdrawn from the PHT module 62, and the PHT processing is performed on the two wafers W1 and W2. In the PHT processing according to the present embodiment, at least one recipe is selectively executed according to the purpose from among a plurality of recipes for PHT processing recorded in a recipe database DB, which will be described later.

Subsequently, when the PHT processing for the wafers W1 and W2 is completed, the transfer arm 71*b* of the wafer transfer mechanism 70 enters the inside of the PHT module 62, and the two wafers W1 and W2 are transferred from the stages 62*a* and 62*b* to the transfer arm 71*b*. At this time, it is preferable to transfer the two wafers W3 and W4 for which the COR processing has been completed to the stages 62*a* and 62*b* of the PHT module 62. That is, it is preferable that the unloading of the wafers W1 and W2 from the PHT module 62 and the loading of the wafers W3 and W4 into the same PHT module 62 are performed at the same time. Further, at this time, it is more preferable that the unloading of the wafers W3 and W4 from the COR module 61 and the loading of two wafers W5 and W6 to be processed next into the same COR module 61 are performed at the same time. As described above, the details of the method of controlling the transfer timing will be described later.

After the two wafers W1 and W2 are unloaded from the PHT module 62, the wafer transfer mechanism 70 holding the two wafers W1 and W2 moves to a position in front of the load lock module 20*b*. Subsequently, the two wafers W1 and W2 are transferred from the transfer arm 71*b* of the wafer transfer mechanism 70 to the stocker (not shown).

When the two wafers W1 and W2 are transferred to the load lock module 20*b*, the inside of the load lock module 20*b* is switched from a decompressed atmosphere to an atmospheric pressure atmosphere, and then communicated with the inside of the loader module 30. Subsequently, the two wafers W1 and W2 are transferred to the wafer transfer mechanism 40 and loaded into the loader module 30. After that, the two wafers W1 and W2 are stored in the CST module 33 by the loader module 30, and CST processing is performed.

When the CST processing for a predetermined time (e.g., 1 minute) is completed, the two wafers W1 and W2 transferred to the CST module 33 are stored in the FOUP 31 placed on the load port 32 by the loader module 30 and then remain in a standby state until processing for the other wafers W3 to W25 is completed.

In this way, a series of orientation processing, COR processing, PHT processing, and CST processing are sequentially performed on all the wafers W1 to W25. When desired processing for all the wafers W1 to W25 is completed and the last wafer W25 is stored in the FOUP 31, a series of wafer processing in the vacuum processing apparatus 1 ends.

Wafer processing and wafer transfer in the vacuum processing apparatus 1 according to the present embodiment are performed as described above. As described above, it is desirable that the transfer timing of the wafer is controlled so that the unloading of the preceding wafers from one processing module and the loading of the current wafers into the same processing module are performed at the same time. However, especially when the variable data assigned to each wafer is different between the preceding wafers and the current wafers, it may not be possible to accurately predict an end timing of the recipe in one processing module and to appropriately control the transfer timing.

Here, if the transfer timing of the current wafers is so early that the current wafers are transferred to the front of the processing module while the recipe for the preceding wafers in the processing module is being continued, the current wafers wait on the transfer arm 71 of the wafer transfer mechanism 70 until processing of the preceding wafers is completed. In general, as described above, in the vacuum processing apparatus 1, since a plurality of wafers W loaded from a plurality of FOUPs 31 are processed in parallel using a plurality of processing modules, if the current wafers wait on the transfer arm 71 as described above, the transfer arm 71 cannot transfer the other wafers W during this time. That is, the other wafers W cannot be processed during this time, and the throughput of the vacuum processing apparatus 1 is thereby lowered.

On the other hand, if the transfer timing of the current wafers is so late that the current wafers are not transferred to the front of the processing module even if the recipe for the preceding wafers in the processing module is completed, the preceding wafers cannot be unloaded from the processing module and waits inside the processing module. When the preceding wafers wait as described above, the other wafers W cannot be processed in the processing module during this time, resulting in a decrease in the throughput. Further, when the preceding wafers wait inside the processing module in this way, due to the influence of residual gas inside the processing module, the processing for the preceding wafers may proceed excessively, and a desired processing result may not be obtained for the preceding wafers.

In this way, when the transfer timing of the wafer cannot be appropriately controlled, there is a risk of a decrease in throughput or a problem in the processing results of the preceding wafers. For this reason, the transfer timing of the wafer is preferably controlled so that the current wafers arrive at a position in front of the processing module between seconds before and 5 seconds after the recipe of the preceding wafers is completed in the processing module, or more preferably controlled so that the current wafers arrive at a position in front of the processing module approximately at the same time as the completion of the recipe of the preceding wafers.

Next, the details of the method of controlling the transfer timing of the wafer W in the vacuum processing apparatus 1 described above will be described. In the following description, a case where a set time for the COR processing in the COR module 61 is t seconds and a set time for the PHT processing in the PHT module 62 is T seconds (t<T), that is, a case where the PHT processing is longer than the COR processing and the processing in the vacuum processing apparatus 1 in the PHT module 62 is rate-limited will be described as an example.

Figure 2:
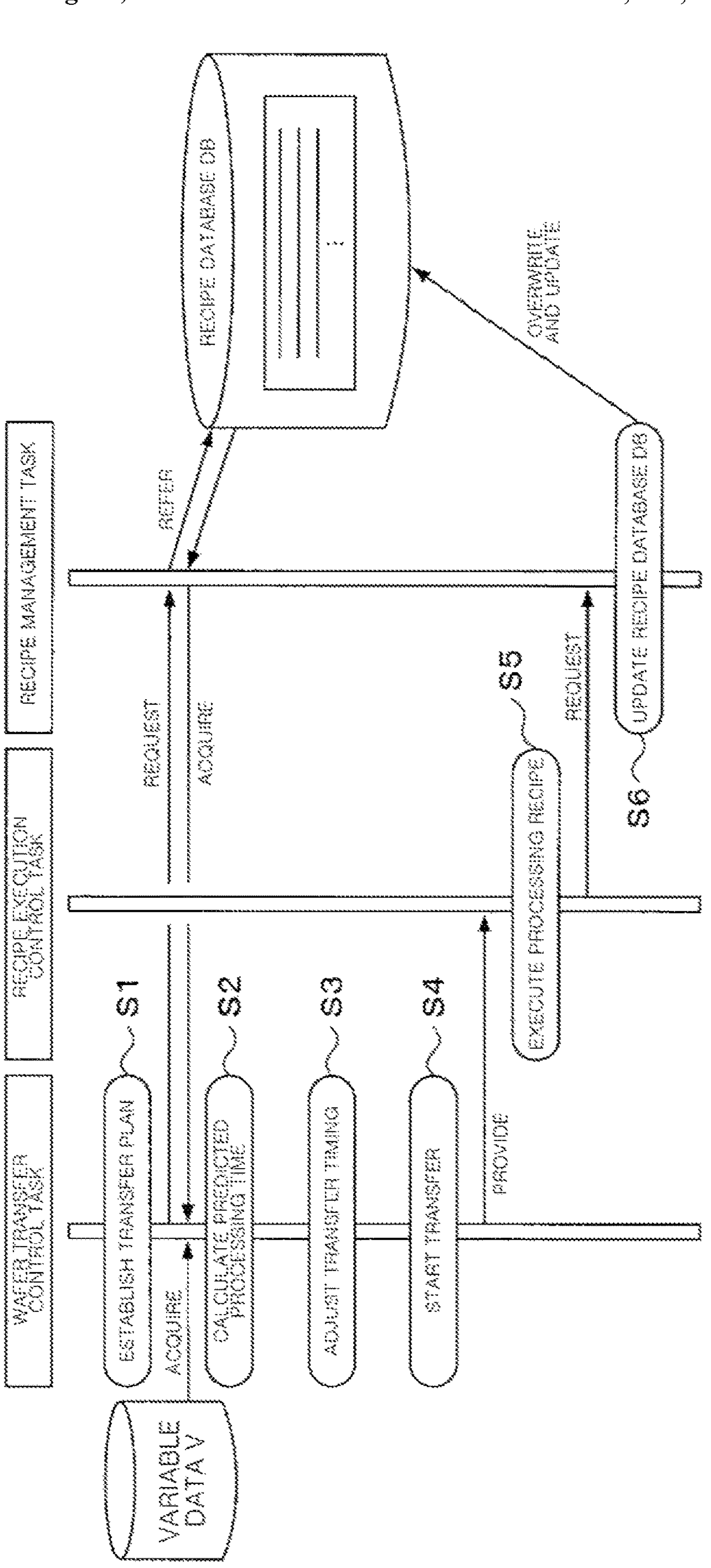
FIG. 2 is a flowchart showing main steps of a method for controlling a transfer timing of a wafer according to the present embodiment.

FIG. 2 is a flowchart simply showing a series of flows of controlling the transfer timing of the wafer according to the present embodiment. As shown in FIG. 2, the above-described “wafer transfer control task”, “recipe execution control task”, and “recipe management task” are used in controlling the transfer timing according to the present embodiment. Further, FIG. 3 is an explanatory diagram schematically showing details of recipe information recorded in the recipe database DB.

First, prior to starting the processing for the wafers W in the vacuum processing apparatus 1, a transfer plan for two wafers W1 and W2 to be processed first by the wafer transfer control task is established (sequence S1 in FIG. 2).

When establishing the transfer plan, the variable data V assigned to the two wafers W1 and W2 is acquired. The variable data V is an adjustment value that is set for each processing step time of various vacuum processing performed on the wafers W1 and W2, and that is input to arbitrarily adjust an execution time of this processing step. By changing this variable data, the execution time of a corresponding processing step for any wafer W can be changed arbitrarily.

A case where the execution time of the corresponding processing step for the wafer W is changed by changing the variable data V is described as an example in the present embodiment, but the variable data V can also control other conditions related to the processing of the wafer W, for example, a flow rate or temperature of gas, and the like.

Further, when establishing the transfer plan, the wafers W1 and W2 for which the transfer plan is to be established are set as the current wafers, and a recipe actual time during transfer of the preceding wafers for which the same recipe was executed before the wafers W1 and W2 and the variable data V assigned to the preceding wafers are acquired. The actual time and the variable data V of the preceding wafers are acquired by, for example, the recipe management task referring to the recipe database DB in which the actual time (measured processing time) of various recipes in previous execution and the variable data V are recorded in pairs.

When the variable data V of the wafers W1 and W2 (current wafers) and the actual time and the variable data V of the preceding wafers are acquired, next, a recipe processing time required when the recipe is executed for the wafers W1 and W2 is predicted based on the various data acquired in the sequence S1 (sequence S2 in FIG. 2).

Specifically, when the variable data V differs between the preceding wafers and the current wafers, the recipe processing time of the preceding wafers and the current wafers fluctuates according to the variable data V difference. That is, for example, in a case where the variable data V of the preceding wafers is 10 seconds and the variable data V of the current wafers is 20 seconds, the recipe processing time for the current wafers is predicted to be 10 seconds longer than the recipe processing time for the preceding wafers. Therefore, in controlling the transfer timing of the wafer according to the present embodiment, the recipe processing time for the current wafers is predicted by the following Equation (1).

$$\text{Recipe Processing Time for Current Wafers[sec]} = \text{Actual Time for Preceding Wafers[sec]} + (\text{Variable Data } V \text{ of Current Wafers[sec]} - \text{Variable Data } V \text{ of Preceding Wafers[sec]}) \quad (1)$$

In the present embodiment, the recipe processing time for the current wafers is predicted in consideration of the difference in the variable data V between the preceding wafers and the current wafers, as described above. By controlling and adjusting the transfer timing of the current wafers as described later based on the recipe processing time predicted as described above, it is possible to suppress a decrease in processing throughput in the vacuum processing apparatus 1 even if the variable data V differs between the wafers W that are processed continuously.

When the recipe processing time for the wafers W1 and W2 is predicted, the two wafers W1 and W2 for which the transfer plan has been established start to be transferred to various processing modules (sequence S4 in FIG. 2), and sequentially, the COR processing and the PHT processing are performed (sequence S5 in FIG. 2). Further, when transferring the wafers to the various processing modules, the wafer transfer control task provides the recipe execution control task with the recipe for the wafers W1 and W2 and the variable data V set as various processing data. Since the wafers W1 and W2 are the first wafers to be processed in the lot, the transfer timing shown in the sequence S3 in FIG. 2 is not adjusted.

When the transfer of the two wafers W1 and W2 and the recipes in the various modules are started, a transfer plan for the two wafers W3 and W4 to be processed next is established (sequence S1 in FIG. 2), and a recipe processing time for the wafers W3 and W4 is predicted (sequence S2 in FIG. 2).

A method of establishing the transfer plan and predicting the recipe processing time for the wafers W3 and W4 are the same as those for the wafers W1 and W2. That is, after acquiring the variable data V assigned to the wafers W3 and W4 and the actual time for the preceding wafers and the variable data V recorded in the recipe database DB, the recipe processing time for the wafers W3 and W4 as the current wafers is predicted based on the above Equation (1).

When the recipe processing time for the wafers W3 and W4 is predicted, based on the established transfer plan and a transfer state (sequence S4) and a processing state (sequence S5) of the two wafers W1 and W2 to be processed earlier, the transfer timing of the two wafers W3 and W4 to various processing modules is adjusted (sequence S3 in FIG. 2).

The relationship between the transfer and processing states (sequences S4 and S5) of the two wafers W1 and W2 and the adjustment of the transfer timing of the two wafers W3 and W4 will be specifically described. FIG. 4 is an explanatory diagram showing how the wafers are transferred in the vacuum processing apparatus 1 over time.

When the recipe processing time for the wafers W1 and W2 is predicted in the sequence S3, as shown in FIG. 4A, the two wafers W1 and W2 for which the transfer plan has been established are taken out from the FOUP 31 and loaded into one COR module 61 via the load lock module 20*a*, and the COR processing is performed for t seconds. This COR processing includes a plurality of processing steps as also shown in the recipe database DB in FIG. 3. The processing time of t seconds for the COR processing described above indicates the recipe processing time as a total time of these plurality of processing steps as shown in FIG. 3.

When the COR processing for the two wafers W1 and W2 is completed, the two wafers W1 and W2 are transferred to the PHT module 62 as shown in FIG. 4B. In the present embodiment, since the PHT processing is longer than the COR processing and the processing is rate-limited in the PHT module 62, the two wafers W1 and W2 for which the COR processing has been completed are loaded into the PHT module 62 without waiting for the two wafers W3 and W4 to be processed next.

When the two wafers W1 and W2 are loaded into the PHT module 62, the PHT processing for T seconds is started. This processing time of T seconds for the PHT processing indicates the recipe processing time as a total time of a plurality of processing steps as shown in FIG. 3.

When the PHT processing for the wafers W1 and W2 is started, the wafers W3 and W4 are then transferred to a position in front of the PHT module 62 via the load lock module 10*a* and the COR module 61. Here, the arrival timing of the wafers W3 and W4 at the position in front of the PHT module 62 is preferably between 5 seconds before and 5 seconds after the completion of the PHT processing of the preceding wafers (wafers W1 and W2), more preferably substantially simultaneously with the completion of the recipe for the preceding wafers, as described above. Therefore, in controlling the transfer timing of the wafer in the present embodiment, a transfer start timing of the current wafers (wafers W3 and W4) from the FOUP 31 is controlled based on the following Equation (2).

$$X = \text{Remaining time of recipe being executed for preceding wafers} - \text{Time required for transferring current wafers to position in front of target processing module} \quad (2)$$

In Equation (2), the "Remaining time of recipe being executed for preceding wafers" indicates a remaining time of the PHT processing on the two wafers W1 and W2 in the PHT module 62, for example. Further, the "Time required for transferring current wafers to position in front of target processing module" indicates a time required for transferring the wafers W3 and W4 from the FOUP 31 to a position in front of the PHT module 62 via the load lock module 10*a* and the COR module 61, for example.

In the present embodiment, when a calculation result of Equation (2) is 0 or more ($X \geq 0$), that is, when the remaining time of the PHT processing for the wafers W1 and W2 is longer than the time required to transfer the wafers W3 and W4, the transfer of the wafers W3 and W4 is not started. In other words, if there is a possibility that a waiting time of the wafers W3 and W4 in front of the PHT module 62 occurs, the transfer of the wafers W3 and W4 is not started, and the wafers W3 and W4 wait inside the FOUP 31 until a timing at which the waiting time of the wafers W3 and W4 in front of the PHT module 62 does not occur. On the other hand, when the calculation result of Equation (2) is otherwise ($X < 0$), that is, when the time required to transfer the wafers W3 and W4 is longer than the remaining time of the PHT processing for the wafers W1 and W2, the transfer of the wafers W3 and W4 is immediately started. In other words, when the waiting time of the wafers W3 and W4 in front of the PHT module 62 does not occur and the waiting time of the wafers W1 and W2 inside the PHT module 62 occurs, the transfer of the wafers W3 and W4 is started.

In the present embodiment, by controlling the transfer start timing of the current wafers based on the remaining time of the recipe for the preceding wafers and the time required to transfer the current wafers in this way, a decrease in throughput in the vacuum processing apparatus 1 can be appropriately suppressed. Further, the remaining time of the recipe used for adjusting the transfer timing is calculated based on the prediction result of the recipe processing time for the preceding wafers calculated in the sequence S2 in FIG. 2. That is, since the transfer start timing is controlled based on the prediction result of the recipe processing time calculated in consideration of the variable data V assigned to the wafer W, even if the variable data V differs between the wafers W that are continuously processed, it is possible to appropriately suppress a decrease in processing throughput in the vacuum processing apparatus 1.

When the transfer timing of the two wafers W3 and W4 is adjusted (sequence S3 in FIG. 2), the two wafers W3 and W4 start to be transferred to various processing modules and processed (sequences S4 and S5 in FIG. 2), and are transferred to the front of the PHT module 62 as shown in FIG. 4C.

Then, when the PHT processing for the wafers W1 and W2 is completed, as shown in FIG. 4D, the wafers W1 and W2 are unloaded from the PHT module 62 and then the wafers W3 and W4 are loaded into the PHT module 62.

After that, the wafers W1 and W2 unloaded from the PHT module 62 are transferred to the CST module 33 via the load lock module 20*b* as shown in FIG. 4E. After that, the wafers W1 and W2 are further transferred to the FOUP 31 by the wafer transfer mechanism 40, thereby completing a series of wafer processing for the wafers W1 and W2.

When the wafer processing for the wafers W1 and W2 is completed, a time actually required for various processing for the wafers W1 and W2 (recipe actual time of the wafers W1 and W2) and the variable data V assigned to the wafers W1 and W2 are stored in the recipe database DB shown in FIG. 2 (sequence S6 in FIG. 2). More specifically, data of the recipe database DB related to a target recipe is overwritten and updated with the recipe actual time and the variable V of the wafers W1 and W2. The overwritten and updated actual time in the recipe database DB and the variable data V are referred to next time the wafers W are processed according to the same recipe.

Meanwhile, when the two wafers W3 and W4 are transferred and the recipes in the various modules are started (sequence S4 and S5 in FIG. 2), as shown in FIG. 4E, a transfer plan for the two wafers W5 and W6 to be processed next is established (sequence S1 in FIG. 2), and a recipe processing time for the wafers W5 and W6 is predicted (sequence S2 in FIG. 2). Further, based on the established transfer plan and the transfer state (sequence S4) and the processing state (sequence S5) of the two wafers W3 and W4 to be processed earlier, a transfer timing of the two wafers W5 and W6 to various processing modules is adjusted (sequence S3 in FIG. 2), and then the two wafers W5 and W6 are transferred and the recipes in the various modules are started (sequences S4 and S5 in FIG. 2).

In the present embodiment, after all the wafers W of one lot (25 wafers) are transferred and processed by the same method as the above-described method shown in FIGS. 2 and 4 in this way, when all the wafers W1 to W25 are transferred to the FOUP 31, a series of wafer processing in the vacuum processing apparatus 1 is completed. In a case where all the wafers W1 to W25 are processed with the same recipe, after the series of wafer processing is completed, an actual time and variable data V of the last processed wafer W25 are recorded in the recipe database DB.

The control of the transfer timing of the wafer according to the present embodiment is performed as described above. In the above embodiment, for clarification of description, the case where a plurality of wafers W are processed using only one COR module 61 and one PHT module 62 has been described as an example. However, by processing the wafers W in parallel by a plurality of COR modules 61 and PHT modules 62, throughput in the vacuum processing apparatus 1 can be of course improved.

As described above, according to the control method of the transfer timing of the wafer according to the present embodiment, the recipe processing time of the wafer W to be processed in the vacuum processing apparatus 1 is calculated according to the above Equation (1) in consideration of a variation of the variable data V, which is an adjustment value (variable) that is arbitrarily input. As a result, even if the variable data V differs between the preceding wafers and the current wafers, it is possible to calculate the processing time for each processing step to be performed on the wafer W or the recipe processing time as the total time of a plurality of processing steps in consideration of the difference in the variable data V appropriately. In other words, a completion timing of the recipe for the current wafers can be calculated in consideration of the difference in the variable data V, so that the transfer timing of the wafer W can be appropriately determined.

Since the transfer timing of the wafer W can be appropriately determined in this way, the waiting time of the current wafers on the transfer arm and the waiting time of the preceding wafers inside the processing module can be reduced. As a result, especially when using a plurality of processing modules in parallel, a time during which the transfer arm is in a standby state while holding the wafer and cannot transfer the other wafers is reduced, and a decrease in throughput in the vacuum processing apparatus 1 is suppressed. Further, a decrease in throughput and an excessive progress of processing for the preceding wafers due to a waiting time of the preceding wafers inside the processing module are suppressed.

Further, since the transfer timing of the wafer W can be appropriately determined in this way, the unloading of the preceding wafers from one processing module and the loading of the current wafers into the same processing module can be performed at the same time. Accordingly, the number of times the wafer transfer mechanism moves to the front of one processing module can be reduced, and as a result, a decrease in throughput in the vacuum processing apparatus 1 is suppressed more appropriately.

Further, according to the above embodiment, the recipe actual time and the variable data V of the current wafers are recorded by overwriting in the recipe database DB in which the actual time and the variable data V of the preceding wafers used for controlling the transfer timing of the wafer are recorded. Although the recipe processing time for the wafer W may change due to, for example, changes in device characteristics of the processing module, by updating the recipe database DB by overwriting in this way, it is possible to always refer to the latest data of the preceding wafers and calculate the recipe processing time. That is, the recipe processing time can be calculated by updating changes in device characteristics and the like over time.

In the above embodiment, the transfer plan for the wafers W is established sequentially for the wafers W before being unloaded from the FOUP 31, but the timing for establishing the transfer plan for the wafers W is not limited to this. That is, in the above embodiment, the transfer of the wafer W (unloading from the FOUP 31) is started after the transfer plan for the entire series of wafer processing is established, but the transfer plan for the wafers W may be established before transferring the wafers W to various processing modules. Specifically, for example, the transfer plan for the COR module 61 may be established for the wafers W waiting inside the FOUP 31, and then the transfer plan for the PHT module 62 may be further established for the wafer W on which the COR processing is being performed.

In the above embodiment, the case where the COR processing in the COR module 61 is shorter than the PHT processing in the PHT module 62 (rate-limited by the PHT processing) has been described as an example. However, of course, even when the COR processing is longer than the PHT processing (rate-limited by the COR processing), or even when the COR processing and the PHT processing have the same processing time, the control of the transfer timing of the wafer according to the technique of the present disclosure can be performed.

As also shown in the recipe database DB of FIG. 3, the COR processing in the COR module 61 and the PHT processing in the PHT module 62 include a plurality of processing steps. The processing steps include a "time step" for performing processing at a predetermined set time, and a "stabilization step" for performing processing until a predetermined processing result (for example, temperature, pressure, and the like) is reached.

In this stabilization step, even if the variable data V differs between the preceding wafers and the current wafers as described above, since the time until a predetermined processing result is obtained is used as the actual time, there is little risk of a decrease in throughput due to fluctuations in the variable data V. On the other hand, in the time step, if the variable data V differs between the preceding wafers and the current wafers as described above, since the actual recipe processing time is used as the actual time, there is a high possibility that throughput will decrease due to fluctuations in the variable data V.

Therefore, in controlling the transfer timing of the wafer according to the present embodiment, the timing control described above may be performed only in the processing steps related to the "time step" among the plurality of processing steps included in the recipe applied to the wafers W. By reducing the number of processing steps for which the timing control is performed in this way, control of processing in the vacuum processing apparatus 1 can be simplified. However, of course, the timing control described above may also be performed for the processing steps related to the "stabilization step".

In the above embodiment, although the case of controlling the transfer timing of the wafer in the vacuum processing apparatus 1 that processes the wafer W under the decompressed atmosphere has been described as an example, the configuration of the wafer processing apparatus to which the technique according to the present disclosure is applied is not limited as long as the wafers W are continuously transferred to the plurality of processing modules and processed. That is, for example, in an atmospheric processing apparatus that continuously performs a plurality of processing under atmospheric pressure, the control of the transfer timing of the wafer according to the technique of the present disclosure may be performed.

Further, although the case where two wafers W are transferred and processed at the same time has been described as an example in the above embodiment, the control of the transfer timing of the wafer according to the technique of the present disclosure can be applied even in a case where the wafer W is processed singly, or three or more wafers are processed.

It should be considered that the embodiments disclosed this time are illustrative in all respects and not restrictive. The embodiments described above may be omitted, substituted, or modified in various ways without departing from the scope and spirit of the appended claims.

DESCRIPTION OF REFERENCE NUMERALS

1: vacuum processing apparatus
V: variable data
W: wafer

The invention claimed is:

1. A method of transferring a plurality of substrates to be continuously processed from a transfer unit to a processing unit in a processing system comprising at least one processing unit for performing desired processing on a substrate and the transfer unit for transferring the substrate to the processing unit, wherein each of the plurality of substrates is assigned in advance with an adjustment value for arbitrarily changing a processing time for the substrate, the method comprising:

obtaining the adjustment value assigned to a first substrate to be processed at this time;

obtaining a reference adjustment value assigned to a reference substrate processed prior to the first substrate;

obtaining an actual time, which is time for an actual processing performed on the reference substrate;

calculating a predicted processing time for the first substrate by reflecting a difference between the adjustment value assigned to the first substrate and the reference adjustment value in the actual time; and adjusting a transfer timing of a second substrate to be processed after the first substrate, based on the calculated predicted processing time.

2. The method of claim 1, wherein in adjusting the transfer timing of the second substrate, a transfer start timing of the second substrate is adjusted by comparing a predicted end time of processing for the first substrate in a processing module, which is calculated from the predicted processing time, and a transfer time of the second substrate to the processing module.

3. The method of claim 2, wherein the transfer start timing is adjusted so that the second substrate is transferred to the processing module between 5 seconds before and 5 seconds after the predicted end time.

4. The method of claim 2, wherein the processing system is provided with a plurality of processing modules for performing various types of processing on the substrate, and the processing module for which the transfer start timing is adjusted is a processing module among the plurality of processing modules that requires a long processing time for the substrate and causes rate-limiting in processing of the substrate in the processing system.

5. The method of claim 1, further comprising:

overwriting and updating the adjustment value assigned to the first substrate with the reference adjustment value after the processing for the first substrate is completed.

6. The method of claim 1, wherein said obtaining the adjustment value assigned to the first substrate and said calculating the predicted processing time for the first substrate are performed before the first substrate is transferred from the transfer unit to the processing unit.

7. A processing system for continuously processing a plurality of substrates, the system comprising:

at least one processing unit for performing desired processing on a substrate;

a transfer unit for transferring the substrate to the processing unit; and a controller for controlling a substrate transfer operation from the transfer unit to the processing unit, wherein each of the plurality of substrates is assigned in advance with an adjustment value for arbitrarily changing a processing time for the substrate, and the controller controls the substrate transfer operation to perform:

obtaining the adjustment value assigned to a first substrate to be processed at this time;

obtaining a reference adjustment value assigned to a reference substrate processed prior to the first substrate;

obtaining an actual time, which is time for an actual processing performed on the reference substrate;

calculating a predicted processing time for the first substrate by reflecting a difference between the adjustment value assigned to the first substrate and the reference adjustment value in the actual time; and adjusting a transfer timing of a second substrate to be processed after the first substrate, based on the calculated predicted processing time.

8. The system of claim 7, wherein in adjusting the transfer timing of the second substrate, the controller adjusts a transfer start timing of the second substrate by comparing a predicted end time of processing for the first substrate in the processing unit, which is calculated from the predicted processing time, and a transfer time of the second substrate to the processing unit.

9. The system of claim 8, wherein the controller adjusts the transfer start timing so that the second substrate is transferred to the processing unit between 5 seconds before and 5 seconds after the predicted end time.

10. The system of claim 8, wherein a plurality of the processing units are provided adjacent to the transfer unit, and the processing unit for which the transfer start timing is adjusted is a processing unit among the plurality of processing units that requires a long processing time for the substrate and causes rate-limiting in processing of the substrate in the processing system.

11. The system of claim 7, wherein the controller overwrites and updates the adjustment value assigned to the first substrate with the reference adjustment value after the processing for the first substrate is completed.

12. The system of claim 7, wherein the controller is configured to perform said obtaining the adjustment value assigned to the first substrate and said calculating the predicted processing time for the first substrate before the first substrate is transferred from the transfer unit to the processing unit.

* * * * *